United States Patent [19]

Matsui et al.

[11] Patent Number: 6,043,540

[45] Date of Patent: Mar. 28, 2000

[54] STATIC RAM HAVING CELL TRANSISTORS WITH LONGER GATE ELECTRODES THAN TRANSISTORS IN THE PERIPHERY OF THE CELL

[75] Inventors: Yuuji Matsui; Juniji Monden, both of Tokyo, Japan

[73] Assignee: NEC Corporation, Tokyo, Japan

[21] Appl. No.: 08/940,957

[22] Filed: Sep. 29, 1997

[30] Foreign Application Priority Data

Oct. 8, 1996 [JP] Japan ................................. 8-026744

[51] Int. Cl.$^7$ ................................................. H01L 21/265
[52] U.S. Cl. .................. 257/368; 257/296; 257/297; 257/298; 257/903; 257/904; 257/907; 257/908; 257/909; 365/200; 365/201; 365/226; 365/229
[58] Field of Search .............................. 257/296–298, 257/903, 904, 907, 908, 909, 368; 365/200, 201, 230.02, 230.08, 226, 229

[56] References Cited

U.S. PATENT DOCUMENTS

| | | | |
|---|---|---|---|
| 5,274,601 | 12/1993 | Kawahara et al. | 365/226 |
| 5,327,002 | 7/1994 | Motoyoshi | 257/380 |
| 5,555,522 | 9/1996 | Anami et al. | 265/200 |
| 5,607,869 | 3/1997 | Yamazaki | 438/286 |
| 5,757,215 | 5/1998 | Schuelke et al. | 327/110 |

FOREIGN PATENT DOCUMENTS 4-192189  7/1992  Japan .
6-053442  2/1994  Japan .

OTHER PUBLICATIONS

Japanese Office Action dated May 18, 1999 with an English language translation of the pertinent information contained therein.

*Primary Examiner*—Fetsum Abraham
*Attorney, Agent, or Firm*—Sughrue, Mion, Zinn Macpeak & Seas, PLLC

[57] ABSTRACT

An SRAM of the present invention has a first load resistor connected between a first power source terminal and a first node, a second load resistor connected between the first power source terminal and a second node, a first drive transistor having a source-drain path connected between the first node and a second power source terminal, and a gate connected to the second node, a second drive transistor having a source-drain path connected between the second node and the second power source terminal, and a gate connected to the first node, a first switching transistor having a source-drain path connected between the first node and a first bit line, and a gate connected to a word line, and a second switching transistor having a source-drain path connected between the first node and a second bit line, and a gate connected to the word line. The first and second drive transistors each has a gate length greater than the gate length of transistors constituting a peripheral circuit other than a sense amplifier circuit and a buffer circuit connected to an external terminal, but smaller than the gate length of the first and second switching transistors.

5 Claims, 6 Drawing Sheets

STATIC RAM HAVING CELL TRANSISTORS WITH LONGER GATE ELECTRODES THAN TRANSISTORS IN THE PERIPHERY OF THE CELL

BACKGROUND OF THE INVENTION

1. Field of the Invention

The present invention relates to a static RAM (SRAM) and, more particularly, to transistors constituting the memory cells of an SRAM.

2. Description of the Related Art

Today, a high resistance load type SRAM is a predominant type of SRAM and has memory cells each being implemented by N type MOSFETs (Metal Oxide Semiconductor Field Effect Transistors) and high resistance loads. For the microstructure of this type of SRAM, transistors constituting a memory cell, decoder circuits and other circuits are provided with a minimum size prescribed by design standards. However, a decrease in the size of transistors has aggravated the influence of the short channel effect of transistors. Particularly, in the memory cells, the subthreshold current (leak current) of drive transistors is increased by the short channel effect, deteriorating the data holding characteristic of the memory cells. This problem has customarily been solved by reducing the load resistance so as to increase the load current.

However, an increase in load current directly translates into an increase in the data holding current of each memory cell. This degrades the merit of the SRAM that power consumption in a waiting state is small.

BRIEF SUMMARY OF THE INVENTION

Object of the Invention

It is therefore an object of the present invention to provide an SRAM capable of enhancing the data holding characteristic of memory cells without increasing a data holding current.

Summary of the Invention

An SRAM of the present invention has a first load resistor connected between a first power source terminal and a first node, a second load resistor connected between the first power source terminal and a second node, a first drive transistor having a source-drain path connected between the first node and a second power source terminal, and a gate connected to the second node, a second drive transistor having a source-drain path connected between the second node and the second power source terminal, and a gate connected to the first node, a first switching transistor having a source-drain path connected between the first node and a first bit line, and a gate connected to a word line, and a second switching transistor having a source-drain path connected between the first node and a second bit line, and a gate connected to the word line. The first and second drive transistors each has a gate length greater than the gate length of transistors constituting a peripheral circuit other than a sense amplifier circuit and a buffer circuit connected to an external terminal, but smaller than the gate length of the first and second switching transistors.

BRIEF DESCRIPTION OF THE DRAWINGS

The above-mentioned and other objects, features and advantages of the present invention will become more apparent by reference to the following detailed description of the invention taken in conjunction with the accompanying drawing in which.

DETAILED DESCRIPTION OF THE INVENTION

Figure 1:
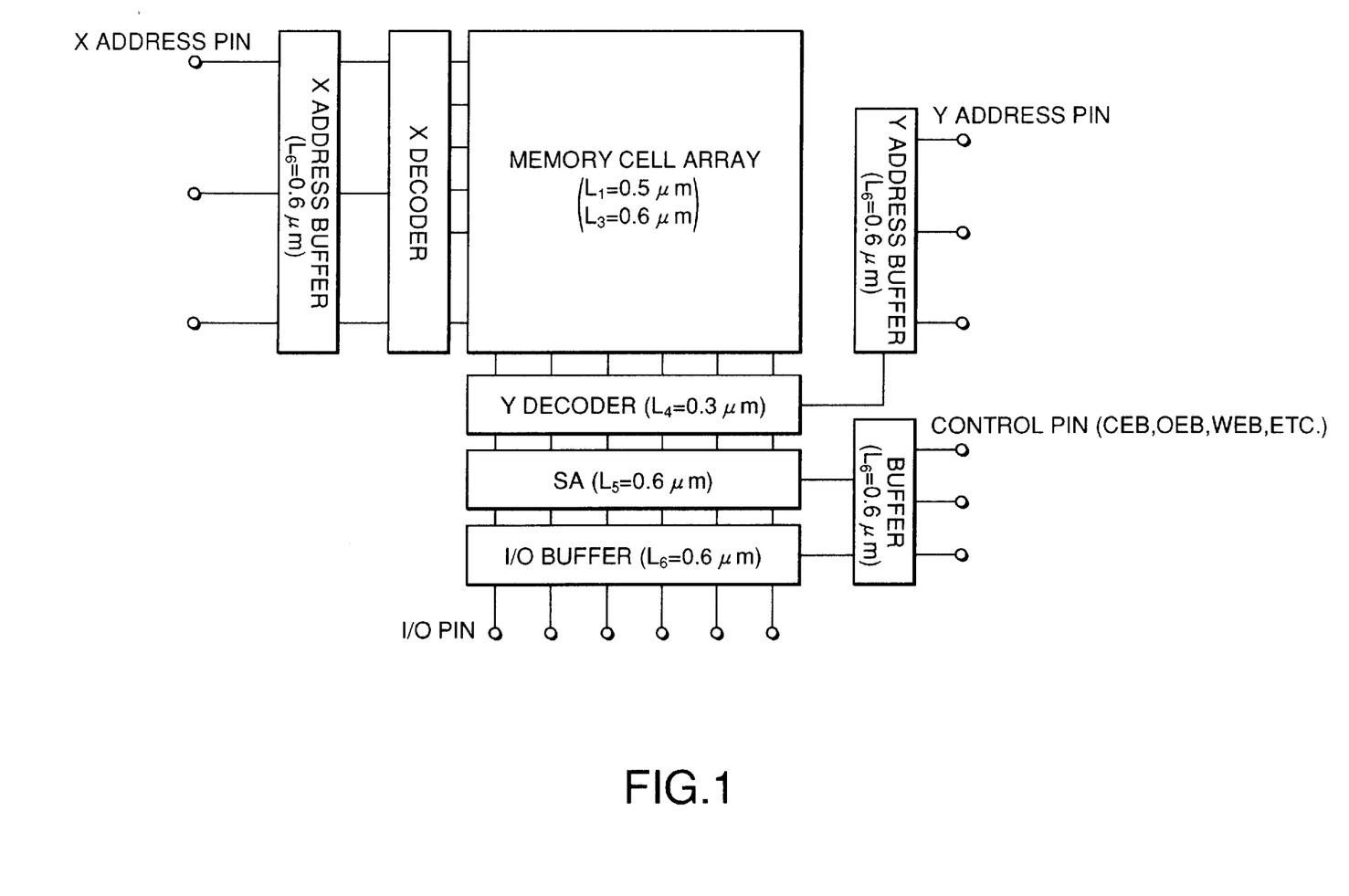
FIG. 1 is a block diagram schematically showing a conventional SRAM.

To better understand the present invention, brief reference will be made to a conventional SRAM, shown in FIG. 1. As shown, the SRAM includes an array of memory cells, i.e., a memory cell array, a sense amplifier circuit (SA) for writing and reading data out of the memory cell array, an X decoder, a Y decoder, an X address buffer, and a Y address buffer. These constituents of the SRAM, except for a part of their transistors, are implemented by transistors of minimum size prescribed by design standards. In FIG. 1, the memory cell array, buffers circuits and sense amplifier circuits are the elements implemented by transistors other than the transistors of minimum size. Let the minimum gate length (L4) be 0.3 mm by way of example.

Figure 2:
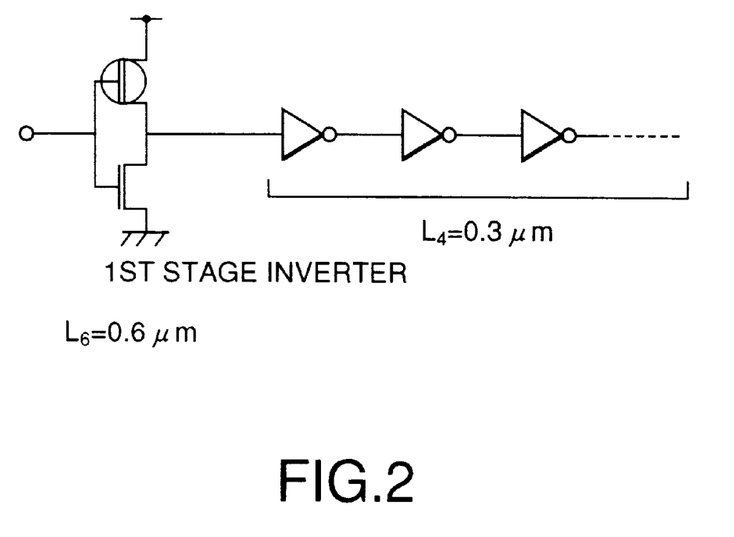
FIG. 2 is a circuit diagram showing a buffer circuit included in the SRAM of FIG. 1.

As shown in FIG. 2, the address buffers each is made up of a first inverter and a second inverter following the first inverter. Transistors constituting the first inverter has a gate length L6 of 0.6 mm while transistors constituting the second inverter have a minimum gate length (L4) of 0.3 mm. The first inverter is connected to an external terminal. Should the transistors constituting the first inverter be provided with the minimum size, they would be excessively sensitive to input signals and would take noise for an address signal. This is why the first inverter connected to the outside terminal has a gate length greater than the minimum size.

Figure 3:
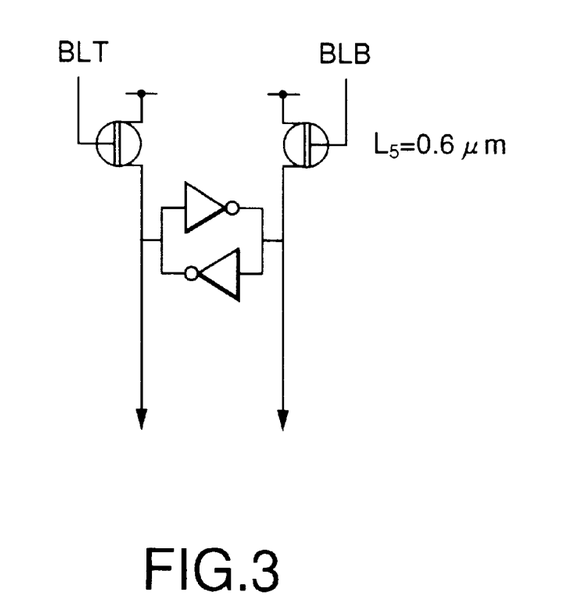
FIG. 3 is a circuit diagram showing a sense amplifier circuit also included in the SRAM

As shown in FIG. 3, transistors constituting the sense amplifier circuit have a gate length L5 of 0.6 mm. Because the sense amplifier circuit is used to amplify small potential differences, it must be free from malfunction ascribable to scattering in gate length. To meet this requirement, the sense amplifier circuit is provided with such a gate length; with a greater gate length, it is possible to relatively reduce scattering in the ability of the transistor.

The circuit elements described above have customarily been implemented by transistors having great gate lengths. The present invention is entirely new in the art in that it pays attention to the size of, among transistors constituting the memory cells, drive transistors heretofore implemented by transistors of minimum size.

Figure 4:
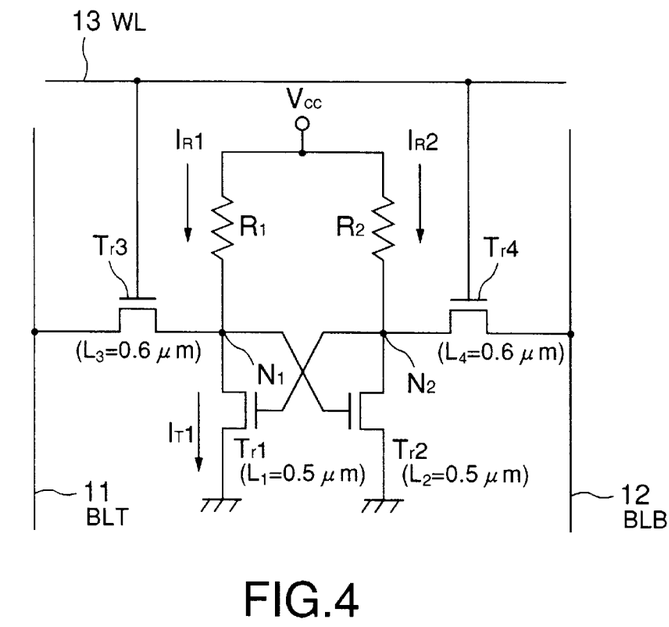
FIG. 4 is a circuit diagram showing a memory further included in the SRAM.

FIG. 4 shows a memory cell included in a high resistance load type SRAM. As shown, the memory cell includes N type drive transistors Rr1 and Tr2 implemented by MOSFETs. Resistors R1 and R2 each having a high resistance are respectively connected to the drive transistors Tr1 and Tr2 via memory nodes N1 and N2. The transistors Tr1 and Tr2 have their drains and gates alternately connected, constituting a flip-flop. Switching transistors Tr3 and Tr4 are respectively connected to the nodes N1 and N2 by bit lines 11 and 12 and controlled by a word line 13.

Assume that the above nodes N1 and N2 store high data and low data, respectively. To hold the data in the memory cell stably, the potential on the node N1 must be sufficiently higher than the threshold voltage Vt of the drive transistor Tr2. Whether or not the potential on the node N1 is sufficiently higher than the threshold voltage Vt, i.e., the stability (holding characteristic) of the memory is determined by the resistance of the resistor R1 and the subthreshold current $I_{T1}$ of the other drive transistor Tr2.

Figure 5:
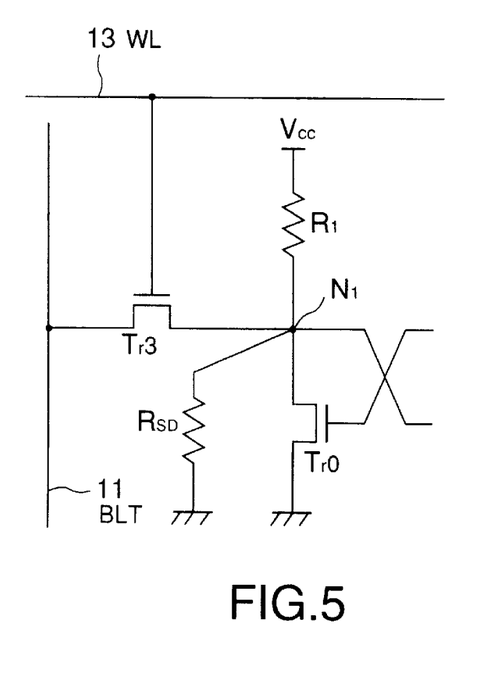
FIG. 5 shows an equivalent circuit representative of a memory cell additionally included in the SRAM.

FIG. 5 shows an equivalent circuit representative of the memory cell of FIG. 4 except that the drive transistor Tr1 is replaced with an ideal transistor Tr0 and a resistance $R_{SD}$. The ideal transistor Tr0 does not allow any leak current to flow when the gate voltage thereof is 0 V. The resistance $R_{SD}$ holds between the source and the drain of the actual drive transistor Tr1 when 0 V is applied to the gate of the transistor Tr1.

Assuming a power source voltage of Vcc, then the potential on the node N1 is expressed, based on resistance division, as:

$$Vcc \times R_{SD}/(R1+R_{SD})$$

If the resistance of the resistors R1 and R2 is low, the potential on the node N1 increases and allows the high data to be easily maintained. However, such a resistance of the resistors R1 and R2 increases a current $I_{R2}$ to flow from the node N2 to the resistor R2 and therefore the data holding current of the memory cell.

An increase in subthreshold voltage $I_{T1}$ means a decrease in resistance $R_{SD}$. As a result, the potential on the node N1 is lowered, degrading the holding characteristic of the memory cell. Generally, a stable high load resistance type memory cell is not achievable unless the subthreshold voltage IT1 is reduced by more than one figure with respect to a load current.

Figure 6:
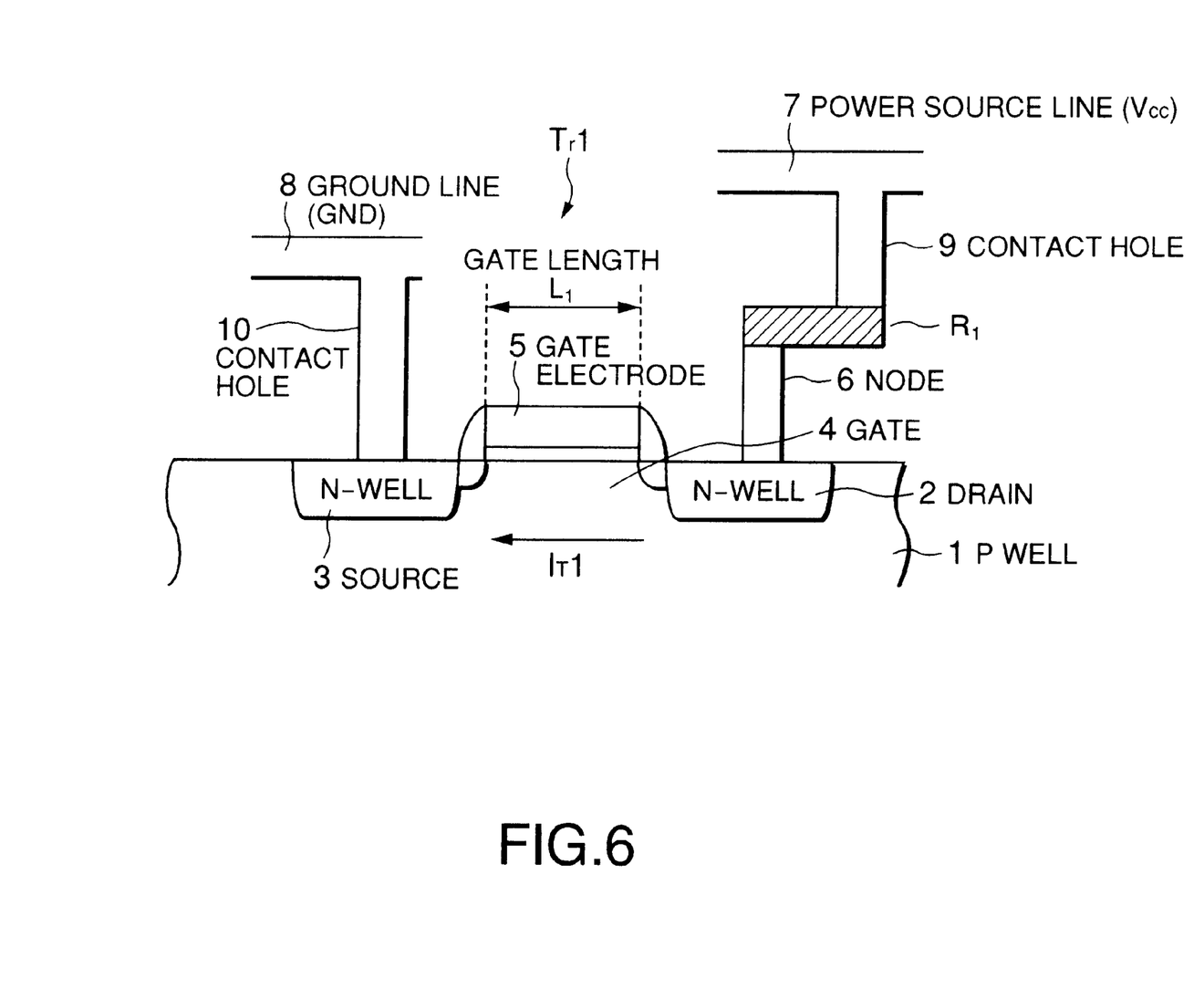
FIG. 6 is a section showing a drive transistor constituting a memory cell included in an SRAM embodying the present invention.
Figure 7:
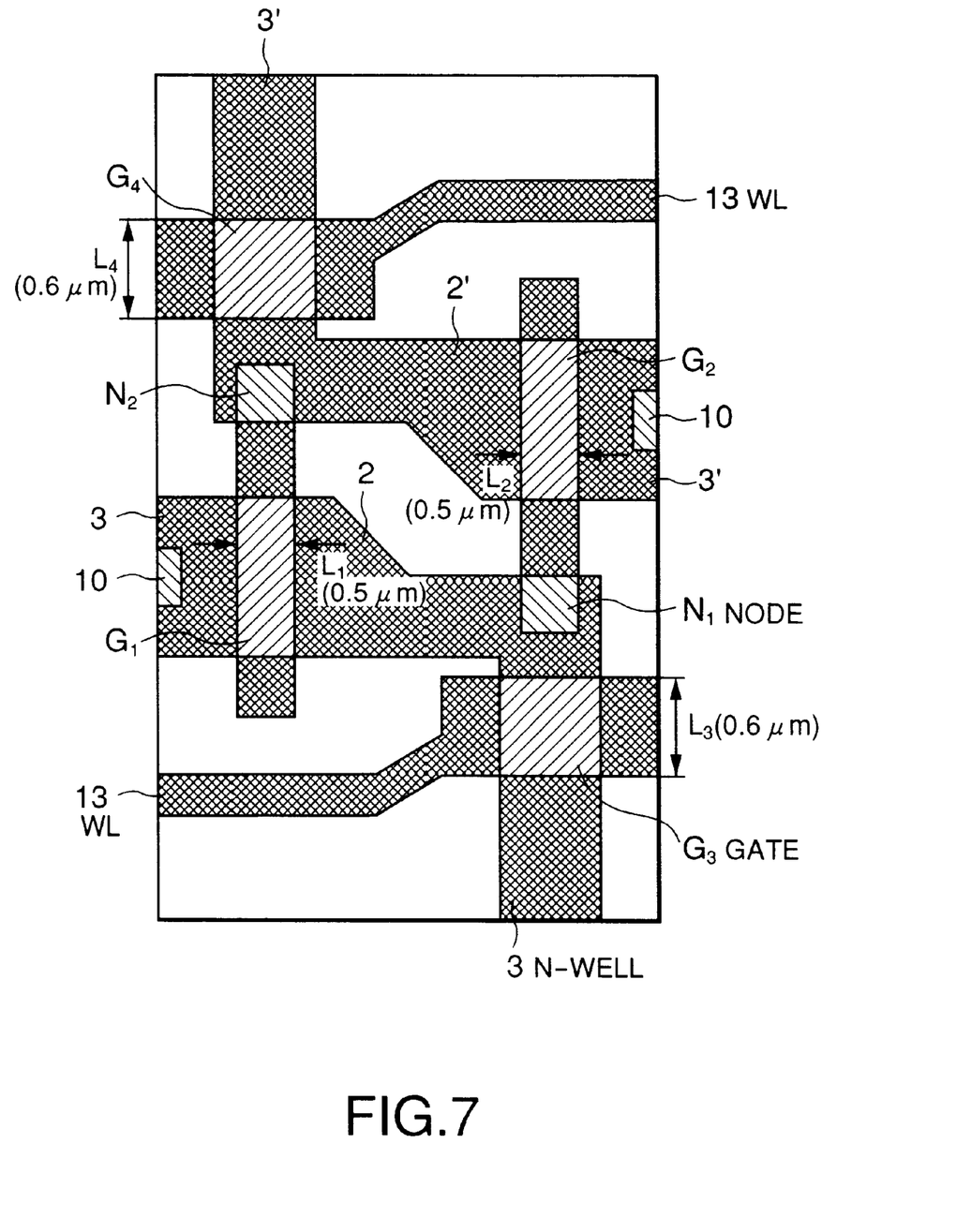
FIG. 7 is a plan view showing memory cells included in the illustrative embodiment.

A static RAM embodying the present invention will be described with reference to FIGS. 6 and 7. FIG. 6 is a section showing a drive transistor Tr1 included in the static SRAM while FIG. 7 is a plan view of a memory cell portion including the transistor Tr1. As shown, the transistor Tr1 includes a P well 1 in which N wells 2 and 3 are formed. The N wells 2 and 3 constitute a drain and a source, respectively. A gate region 4 and a gate electrode (G1) 5 are provided between the N wells 2 and 3. The N well 2 is connected to a resistor R1 having a high resistance via a node 6 which is, in turn, connected to a power source line ($V_{cc}$) 7 via a contact hole 9. The N well 3 is connected to a ground line (GND) via a contact hole 10.

Switching transistors (Tr3 and Tr4) included in a memory cell are provided with lower driving ability than drive transistors (Tr1 and Tr2) also included in the memory cell, so that data stored in the memory cell are prevented from being reversed. Specifically, the gate length of the switching transistors is increased in order to reduce the driving ability. It has been customary to provide the switching transistors with a gate length of 0.6 mm and to provide the drive transistors with a minimum gate length of 0.3 mm. This, however, increases the subthreshold voltage of the drive transistors due to the short channel effect and thereby deteriorates the holding characteristic of the memory cell.

In light of the above, in accordance with the present invention, drive transistors each has a gate length of 0.5 mm which is greater than the minimum size of transistors constituting peripheral circuits (0.3 mm in the illustrative embodiment). Because switching transistors each has a gate length (L4) of 0.6 mm, they have a lower driving ability than the above drive transistors and prevent data from being reversed. Generally, the peripheral circuits includes a sense amplifier circuit and buffer circuits connected to external terminals. In accordance with the present invention, the sense amplifier circuit and buffer circuits are excluded because each of them includes transistors whose gate length is greater than the minimum value. In each decoder circuit shown in FIG. 1, all the transistors have the minimum value. Therefore, the gate length of the above drive transistors is greater than the gate length of the transistors of the decoder circuits.

Figure 8:
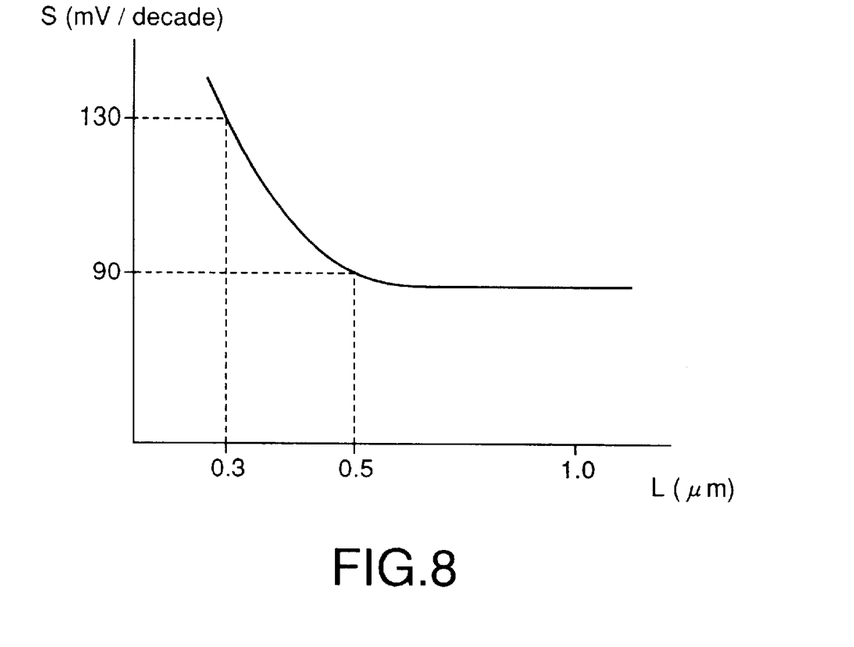
FIG. 8 is a graph showing a relation between the threshold factor of drive transistors constituting the memory cells of an SRAM and a gate length.

Generally, the subthreshold current of a transistor increases with a decrease in the gate length L due to the short channel effect. FIG. 8 shows a relation between the subthreshold factor S and the gate length L of a transistor. As shown, the subthreshold factor S remains substantially constant when the gate length L is greater than 0.5 m. However, the subthreshold factor S increases when the gate length L is smaller than 0.5 mm.

The threshold factor S mentioned above refers to an amount by which the gate voltage of a transistor lower than the threshold voltage Vt must be varied in order to vary the drain current of the transistor to vary by one figure. Therefore, an increase in subthreshold factor S means an increase in subthreshold current.

In the illustrative embodiment, use is made of transistors whose minimum gate length L is 0.3 mm. As for the peripheral circuits of the SRAM including logic circuits and decoders, importance is attached to the operation speed of transistors, i.e., an increase in threshold current ascribable to the minimum gate length L is not a serious problem. For this reason, the transistors of the peripheral circuits are implemented by N type MOSFETs having a gate length of 0.3 mm.

As for the memory cell, if the gate length L of the drive transistors is selected to be 0.3 mm which is the minimum size, then the threshold current increases and lowers the potential of the node storing high data. As a result, the holding characteristic of the memory cell is deteriorated. In the worst case, the data of the above memory cell is destroyed when read out.

Assume that the gate length L of the N type transistors, also implementing the drive transistors of the memory cell, and the subthreshold factor S have the relation shown in FIG. 8. Then, the subthreshold factor S is 130 mV/decade when the gate length L is 0.3 mm or 90 mV/decade when the gate length L is 0.5 mm.

Figure 9:
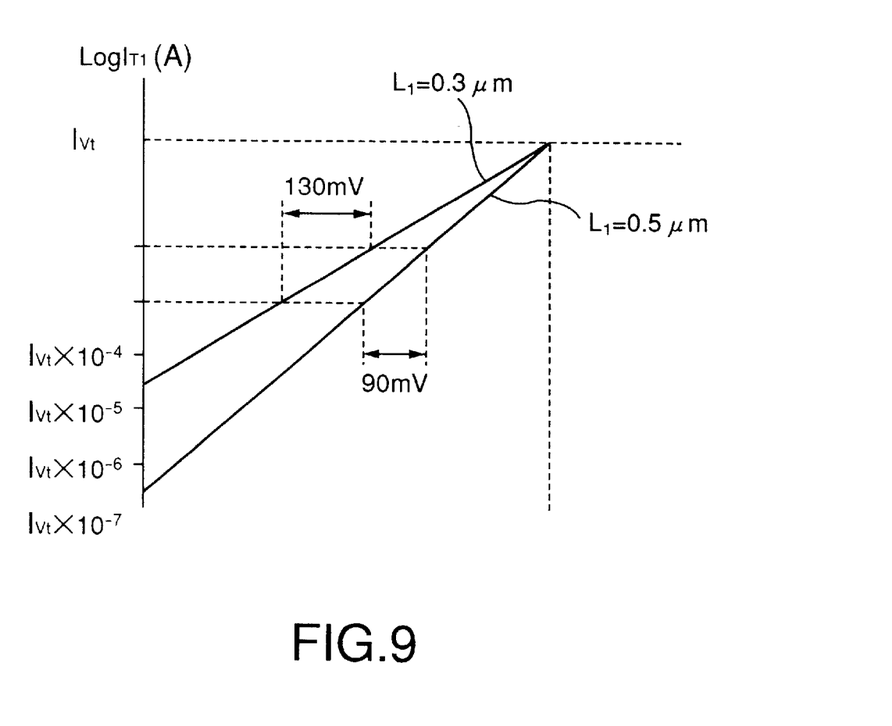
FIG. 9 shows a relation between the drain current and the gate voltage of the drive transistors.

Assume two different kinds of N type transistors having the subthreshold factor S shown in FIG. 8 and respectively having gate lengths of 0.3 mm and 0.5 mm, and a threshold voltage Vt of 0.6 V. FIG. 9 shows a relation between a subthreshold current $I_{VT}$ and a gate voltage VG determined in the above conditions. In FIG. 9, the subthreshold current $I_{VT}$ corresponds to the gate voltage of 0.6 V.

As shown in FIG. 9, assume that the subthreshold current $I_{VT}$ varies logarithmically while the gate voltage VG varies from 0 V to the threshold voltage Vt of 0.6 V. Then, it will be seen that the subthreshold current $I_{VT}$ corresponding to the gate voltage VG of 0 V is about $1_{T1} \times 10^{-4.6}$ when the gate length L is 0.3 mm or about $1_{T1} \times 10^{-6.6}$ when the gate length L is 0.5 mm; the two subthreshold currents $I_{VT}$ are different from each other by almost two figures. Therefore, when the gate length L of the drive transistors is to be reduced from 0.5 mm to 0.3 mm, a data holding characteristic equivalent to the characteristic available with the gate length L of 0.5 mm is not attainable unless the load resistances R1 and R2 each is reduced by two figures. This, however, would increase the data holding current of the memory cell and thereby aggravates power consumption.

To reduce the data holding current while preserving the data holding characteristic, it is necessary to make the gate length of the N type drive transistors of the memory cell greater than the minimum gate length L of the SRAM. If the minimum gate length L is 0.3 mm, then the gate length of the drive transistors should only be 0.5 mm.

In summary, in accordance with the present invention, N type drive transistors constituting the memory cell of an SRAM have a gate length greater than the gate length of N type transistors constituting peripheral circuits. With this configuration, the memory cell achieves an improved holding characteristic and thereby reduces a data holding current.

Although the invention has been described with reference to a specific embodiment, this description is not meant to be construed in a limiting sense. Various modifications of the disclosed embodiment will become apparent to persons skilled in the art upon reference to the description of the invention. It is therefore contemplated that the appended claims will cover any modifications or embodiments as fall within the true scope of the invention.

What is claimed is:

1. An SRAM comprising:

a first load resistor connected between a first power source terminal and a first node;

a second load resistor connected between said first power source terminal and a second node;

a first drive transistor having a source-drain path connected between said first node and a second power source terminal, and a gate connected to said second node;

a second drive transistor having a source-drain path connected between said second node and said second power source terminal, and a gate connected to said first node;

a first switching transistor having a source-drain path connected between said first node and a first bit line, and a gate connected to a word line; and a second switching transistor having a source-drain path connected between said first node and a second bit line, and a gate connected to said word line;

said first and second drive transistors each having a gate length greater than a gate length of transistors constituting a peripheral circuit other than a sense amplifier circuit and a buffer circuit connected to an external terminal, but smaller than a gate length of said first and second switching transistors.

2. An SRAM as claimed in claim 1, wherein said second drive transistor and said first and second switching transistors each comprises an N type MOSFET.

3. An SRAM as claimed in claim 1, wherein said peripheral circuit comprises a decoder circuit.

4. An SRAM as claimed in claim 1, wherein the gate length of said first and second dive transistors is substantially 5 mm.

5. An SRAM comprising:

a memory cell array comprising memory cells arranged in an array;

an address buffer circuit for receiving an address input via an external terminal;

a decoder circuit connected to said address buffer circuit; and a sense amplifier circuit connected to an input/output buffer;

transistors constituting said memory cells each having a gate length greater than a gate length of transistors constituting said decoder circuit.

* * * * *

UNITED STATES PATENT AND TRADEMARK OFFICE
CERTIFICATE OF CORRECTION

PATENT NO. : 6,043,540
DATED : March 28, 2000
INVENTOR(S) : Matsui, Yuuji, Monden, Junji

It is certified that error appears in the above-identified patent and that said Letters Patent is hereby corrected as shown below:

On the Title Page:

Priority Data: delete "8-026744" and insert --8-267441--

Signed and Sealed this

Third Day of April, 2001

Attest:

NICHOLAS P. GODICI

*Attesting Officer*     *Acting Director of the United States Patent and Trademark Office*